(12) United States Patent
Kirkhart

(10) Patent No.: US 7,305,217 B2
(45) Date of Patent: Dec. 4, 2007

(54) LOW COST PLANAR DOUBLE BALANCED MIXER

(76) Inventor: Rod Kirkhart, 2205 Gila Way, Sacramento, CA (US) 95864

( * ) Notice: Subject to any disclaimer, the term of this patent is extended or adjusted under 35 U.S.C. 154(b) by 322 days.

(21) Appl. No.: 10/942,055

(22) Filed: Sep. 16, 2004

(65) Prior Publication Data

US 2006/0057988 A1   Mar. 16, 2006

(51) Int. Cl.
*H04B 1/28* (2006.01)
*H04B 1/26* (2006.01)

(52) U.S. Cl. .................................. 455/189.1; 455/326

(58) Field of Classification Search ............ 455/189.1, 455/326, 331, 332, 333, 330, 327, 319, 323, 455/314, 207, 22, 180.1, 176.1, 168.1, 146; 333/238, 116, 26, 25; 327/206, 207, 210, 327/220, 272, 329
See application file for complete search history.

(56) References Cited

U.S. PATENT DOCUMENTS 5,740,528 A * 4/1998 Drennen ..................... 455/330
5,774,801 A * 6/1998 Li et al. ..................... 455/326
5,854,974 A * 12/1998 Li ............................... 455/330
6,917,796 B2 * 7/2005 Setty et al. ................. 455/326
7,013,122 B2 * 3/2006 Gamliel ...................... 455/330
7,027,795 B2 * 4/2006 Ji ............................... 455/333
7,072,636 B2 * 7/2006 Dobrovolny ................ 455/313
2003/0068996 A1 * 4/2003 Setty et al. ................. 455/313
2004/0185816 A1 * 9/2004 Ji ............................... 455/313

* cited by examiner

*Primary Examiner*—Aung Moe
(74) *Attorney, Agent, or Firm*—Siegmar Silber

(57) ABSTRACT

A double balanced mixer includes a local oscillator balun, a radio frequency balun and four diodes. The local oscillator balun has a transmission line, a half wavelength transmission line and a quarter wavelength transmission line mounted on a printed circuit board. The radio frequency balun has a transmission line, a half wavelength transmission line and a printed circuit line mounted on a printed circuit board. The four diodes are mounted to the printed circuit board and connected between the local oscillator balun and the radio frequency balun.

25 Claims, 9 Drawing Sheets

LOW COST PLANAR DOUBLE BALANCED MIXER

BACKGROUND

1. Field of the Invention

This invention relates to mixers in general and more particularly to a low cost planar double balanced mixer for narrow frequency bandwidths.

2. Description of Related Art

A mixer circuit converts a radio frequency (RF) signal to an intermediate frequency (IF) signal which is the difference of the RF and a local oscillator (LO) signal. The IF frequency is obtained by multiplying the RF signal with the local oscillator (LO) signal.

Passive double balanced mixers are used widely in systems where frequency translation is required. Most of today's mixer designs are designed to perform at moderate to very broad frequency ranges. Although applications exist where multi-octave bandwidth is necessary, many modern radio systems only require relatively narrow band performance. The process for achieving broad frequencies in mixers generally requires multi-layer broadside coupled baluns. Typically, these designs are difficult and expensive to design and manufacture requiring the use of jumpers, bridges, vias and bond wires.

Mixers using multi-layer broadside coupled baluns offer good broadband performance. However, the cost is high. Many applications do not require wide bandwidths. In some instances, unnecessarily wide bandwidths can allow the passage of stray signals and harmonics requiring the use of additional filters. It is advantageous for a mixer to have optimal performance at the specific frequency required by the radio designer.

A continuing need exists for a mixer that has improved electrical performance such as increased isolation and reduced conversion loss. A continuing need also exists for a mixer that has a small overall size that can be manufactured at low cost and that can be easily simulated and developed.

SUMMARY

It is a feature of the invention to provide a double balanced mixer for mixing a radio frequency signal with a local oscillator signal to provide at an output an intermediate frequency signal. The mixer has a small package size that is easily assembled at low cost.

Another feature of the invention is to provide a mixer that includes a printed circuit board having a top surface and a bottom surface. A first transmission line is mounted on the top surface. The first transmission line has a first and second end. A local oscillator port is connected to the first end. A first half wavelength transmission line is mounted on the top surface. The first half wavelength transmission line has a third and fourth end. The second end is connected to the third end. A quarter wavelength transmission line is mounted on the top surface. The quarter wavelength transmission line has a fifth and sixth end. The fifth end is connected to the fourth end and the sixth end is connected to ground. A second transmission line is mounted on the top surface. The second transmission line has a seventh and eighth end. A capacitor is mounted to the top surface and connected to the eighth end. A radio frequency port is connected to the capacitor. A second half wavelength transmission line is mounted on the top surface. The second half wavelength transmission line has a ninth and tenth end. The ninth end is connected to the seventh end. A circuit line is mounted on the top surface. The circuit line has an eleventh and twelfth end. The eleventh end is connected to the tenth end. An intermediate frequency port is connected to the twelfth end. A diode package is mounted to the top surface.

BRIEF DESCRIPTION OF THE DRAWINGS

It is noted that the drawings of the invention are not to scale. In the drawings, like numbering represents like elements between the drawings.

DETAILED DESCRIPTION

Figure 1:
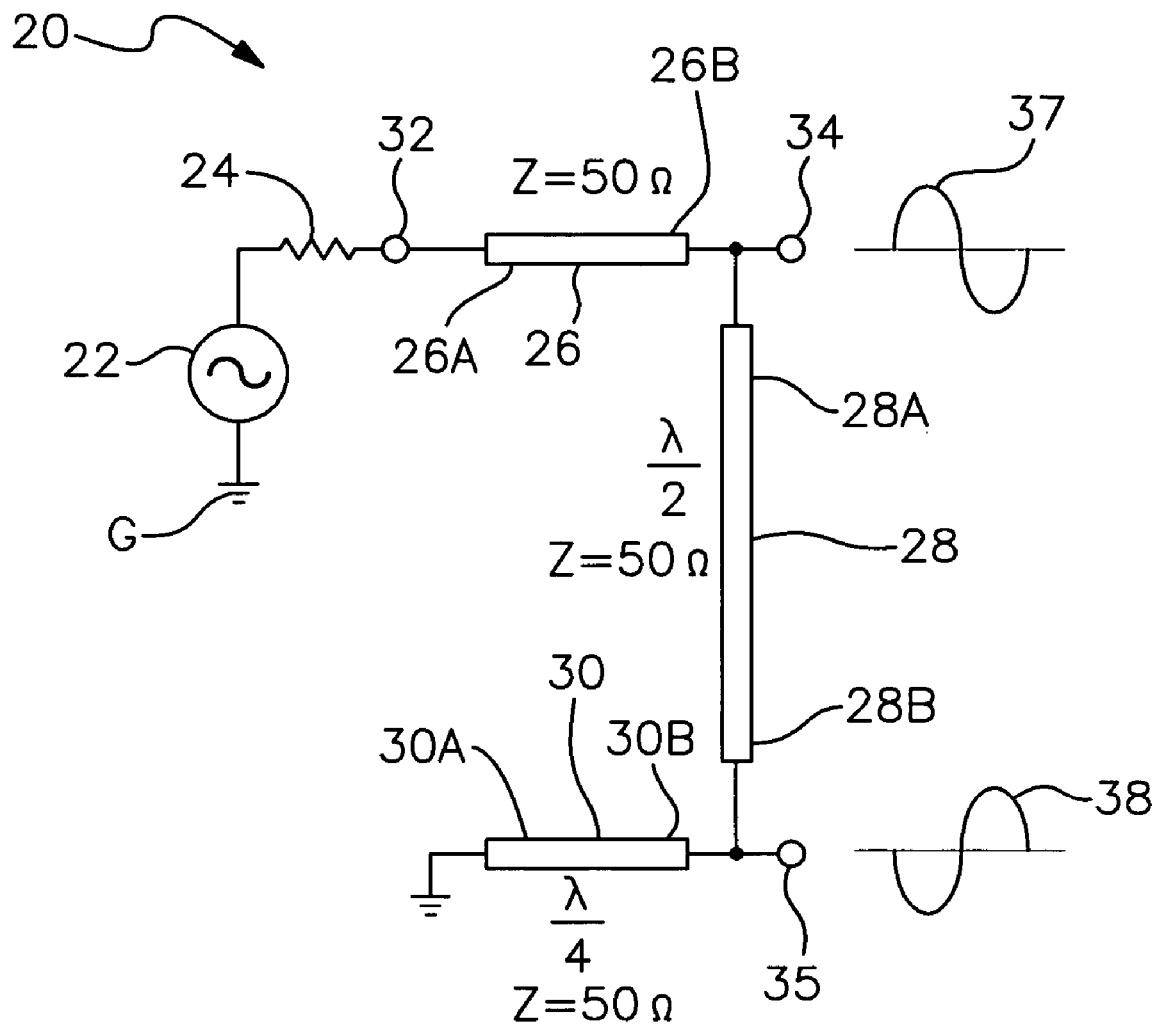
FIG. 1 is a schematic diagram of a local oscillator balun.

Referring to FIG. 1, a schematic diagram of a local oscillator (LO) balun 20 is shown. LO balun 20 has a local oscillator source 22 connected between ground G and a 50 ohm resistor 24. The 50 ohm resistor represents the output impedance of local oscillator source 22. A 50 ohm transmission line 26 has ends 26A and 26B. The 50 ohm impedance produces ideal matching and maximum power transfer. A local oscillator terminal or port 32 is attached to end 26A. End 26B is connected to a terminal or node 34.

A half wavelength transmission line 28 is connected to transmission line 26 and has ends 28A and 28B. End 28A is connected to node 34. End 28B is connected to terminal or node 35. The half wavelength transmission line 28 produces the required 180 degree phase shift at the center operating frequency needed for double balanced mixer operation. As shown on FIG. 1, waveforms 37 and 38 are 180 degrees out of phase.

A quarter wavelength transmission line 30 has ends 30A and 30B and is connected to half wavelength transmission line 28. End 30A is connected to ground. End 30B is connected to terminal or node 35. The quarter wavelength transmission line 30 is required for ground return from the local oscillator (LO), radio frequency (RF) and intermediate frequency (IF) signals. A quarter wavelength transmission line is used in order to prevent the diodes (62 in FIG. 3) from being shorted to ground while allowing the full voltage swing of the LO signal to be available to the diodes. The transmission lines 26, 28 and 30 can be fabricated as microstrip lines on a ceramic or printed circuit board.

Figure 2:
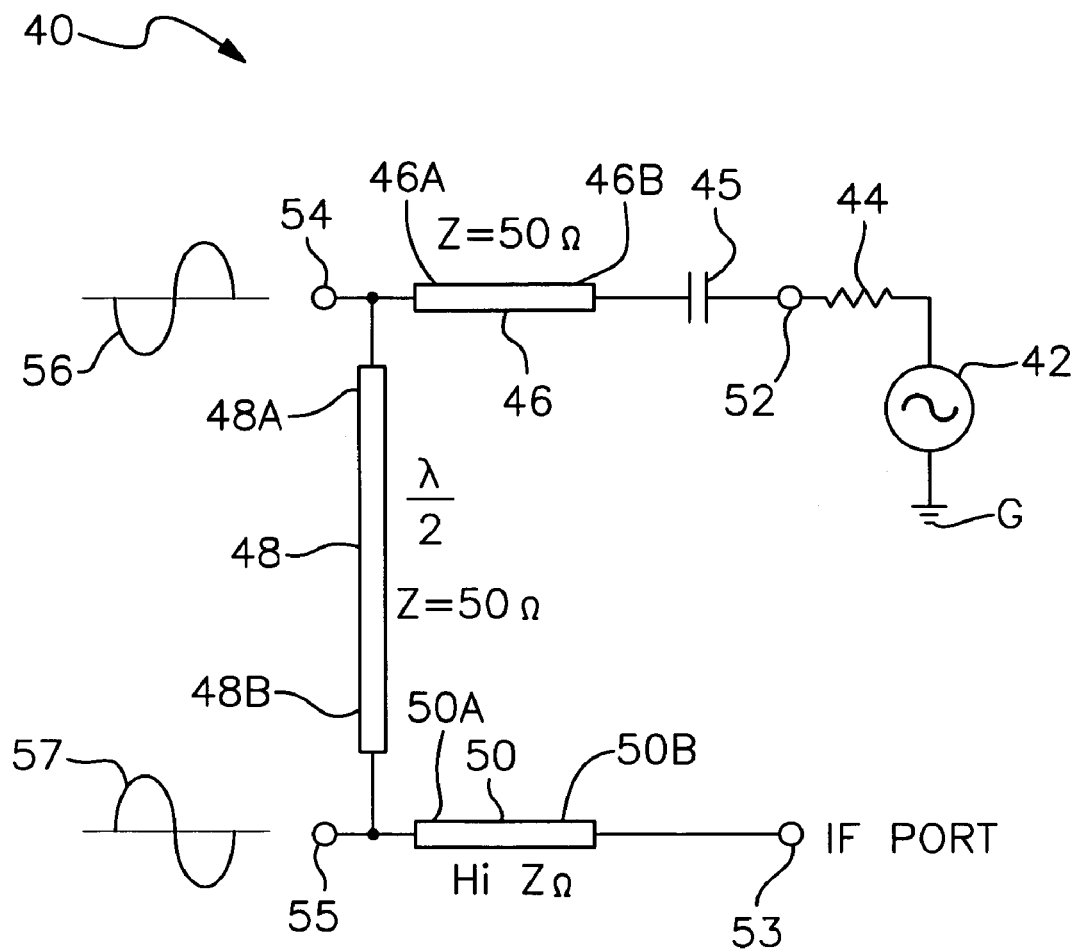
FIG. 2 is a schematic diagram of a radio frequency balun.

Referring to FIG. 2, a schematic diagram of a radio frequency (RF) balun 40 is shown. The RF balun 40 is similar to LO balun 20. RF balun 40 has a RF source 42 connected between ground G and a 50 ohm resistor 44. The 50 ohm resistor represents the output impedance of RF source 42. A RF terminal or port 52 is attached to resistor 44.

A capacitor 45 has one end connected to port 52. Capacitor 45 needs to be small enough to prevent the IF signal from being terminated at the RF port 52, yet large enough to pass the RF signal without significant loss. Capacitor 45 can be a discrete component or can utilize the self-capacitance of transmission line 50 in certain designs. This capacitor is not required at the LO port 32, since the LO Balun is at ground potential at the IF frequencies.

A 50 ohm transmission line 46 has ends 46A and 46B. End 46A is connected to node 54 and end 46B is connected to capacitor 46B. The 50 ohm impedance produces ideal matching and maximum power transfer.

A half wavelength transmission line 48 is connected to transmission line 46 and has ends 48A and 48B. End 48A is connected to node 54. End 48B is connected to terminal or node 55. The half wavelength transmission line 48 produces the required 180 degree phase shift at the center operating frequency needed for double balanced mixer operation. As shown on FIG. 2, waveforms 56 and 57 are 180 degrees out of phase.

A circuit line or trace 50 has ends 50A and 50B and is connected to half wavelength transmission line 48. End 50A is connected to node 55. End 50B is connected to intermediate frequency (IF) terminal or port 53. Circuit line 50 does not need to be a quarter wave transmission line because the RF ground return is through the LO balun 20. If a quarter wave transmission line was used for circuit line 50, it would short the IF signal to ground. The location of the IF port 53 is chosen so as not to affect the RF operation of the balun. Circuit line 50 needs to be high enough in impedance to prevent the RF signal from being terminated, yet low enough to achieve the desired IF frequency bandwidth. The high impedance of the circuit line 50 further increases the LO to IF isolation except for leakage due to mismatched diodes. The lines 46, 48 and 50 can be fabricated as microstrip lines on a ceramic or printed circuit board.

Figure 3:
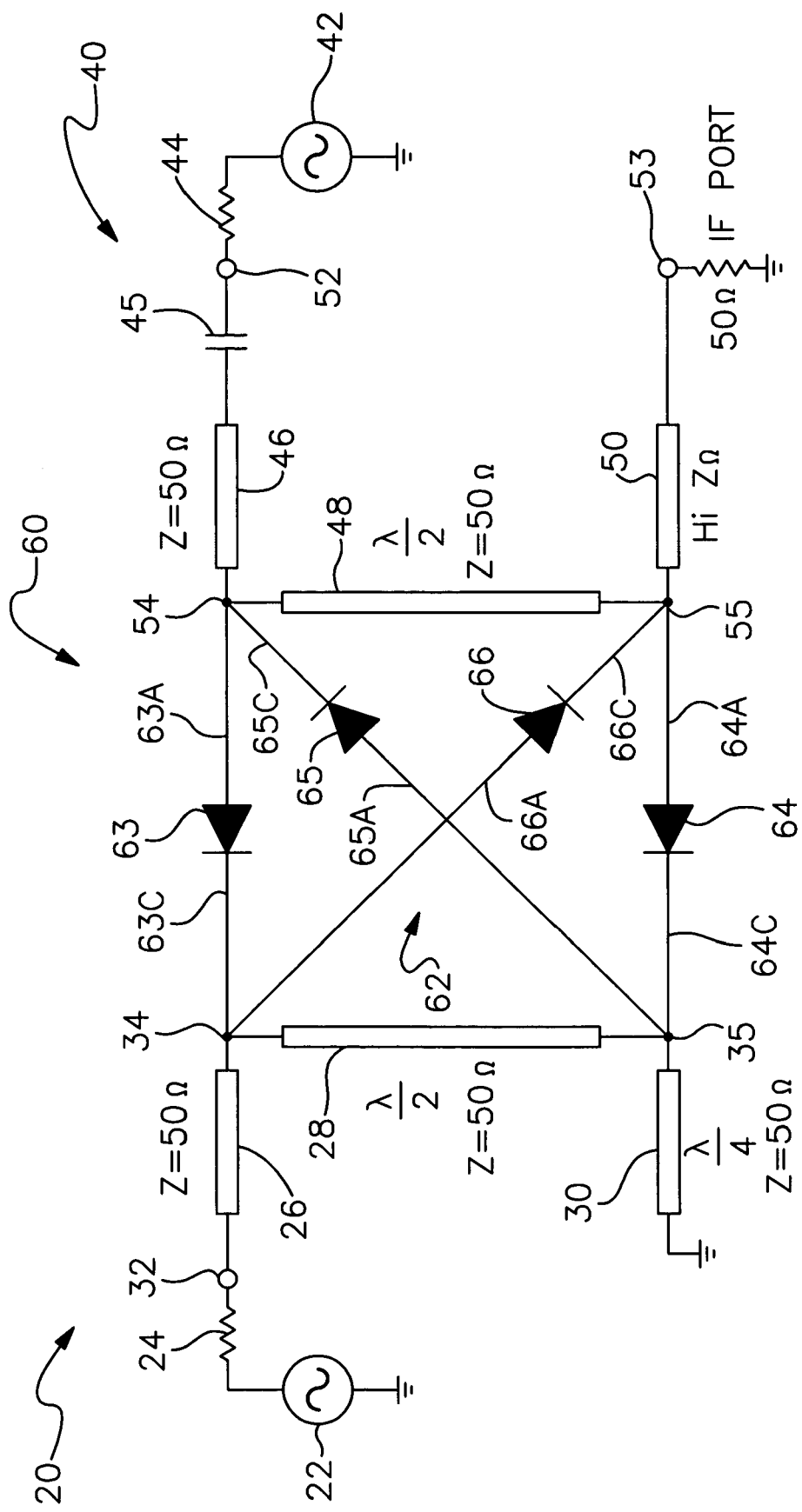
FIG. 3 is a schematic diagram of a double balanced mixer in accordance with the present invention.

Referring to FIG. 3, a schematic diagram of a double balanced mixer 60 is shown. Mixer 60 has a diode package 62 that is connected between the RF balun 40 and the LO balun 20. The diode package 62 is made up of four diodes 63, 64, 65 and 66. Diode 63 is connected between nodes 34 and 54. Diode 64 is connected between nodes 35 and 55. Diode 65 is connected between nodes 35 and 54. Diode 66 is connected between nodes 34 and 55.

The diodes each have an anode and a cathode. Diode 63 has an anode 63A and a cathode 63C. Diode 64 has an anode 64A and a cathode 64C. Diode 65 has an anode 65A and a cathode 65C. Diode 66 has an anode 66A and a cathode 66C. The diodes have their cathodes connected to the anodes of the adjoining diodes. Anode 63A is connected to cathode 65C. Anode 64A is connected to cathode 66C. Anode 65A is connected to cathode 64C. Anode 66A is connected to cathode 63C.

Figure 4:
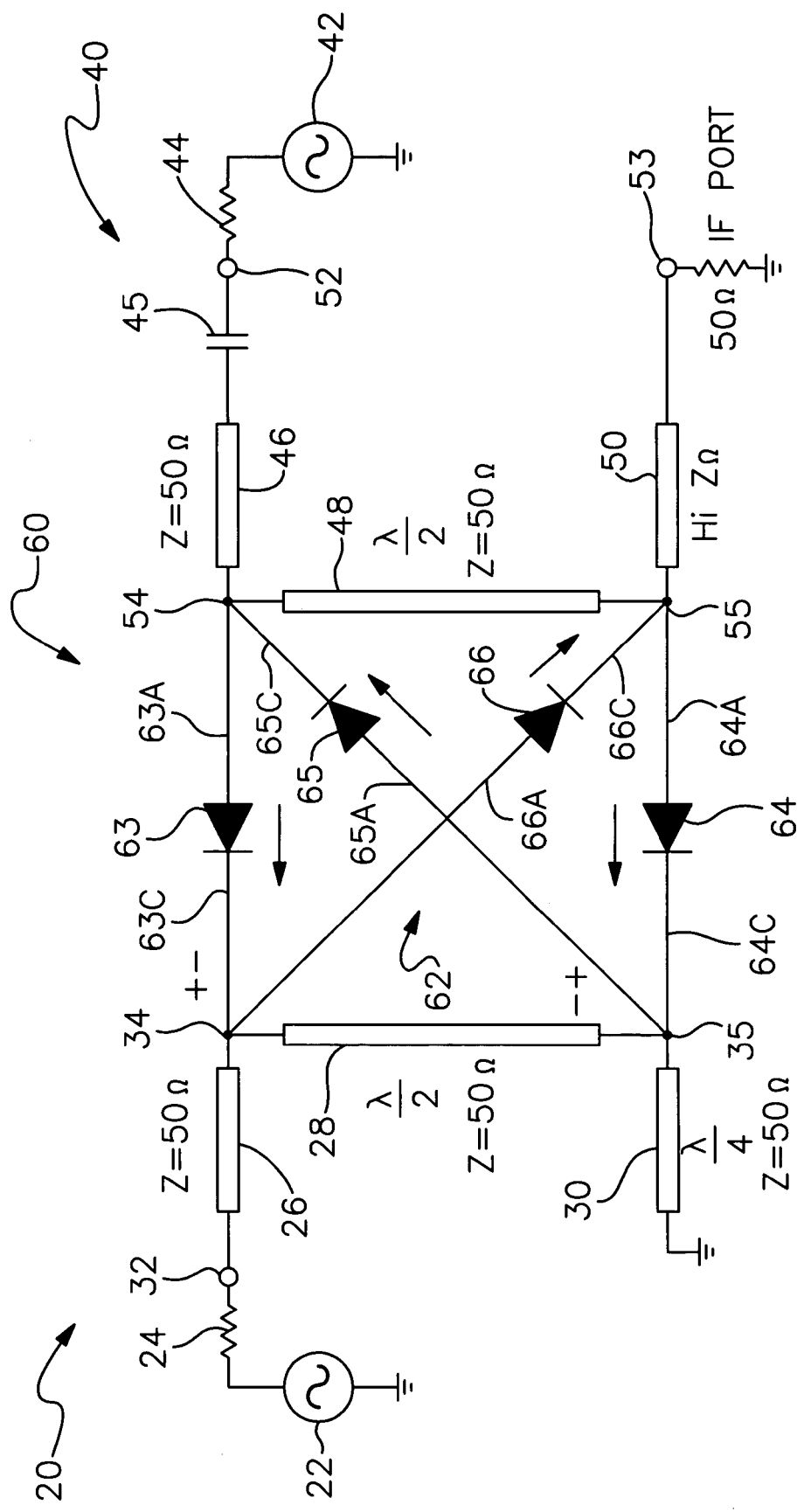
FIG. 4 shows the current flow in the mixer of FIG. 3 during operation.

Referring to FIG. 4, the current flow in mixer 60 during operation is shown. The signal from LO source 22 forward biases two of the diodes while reverse biasing the other two diodes. As the signal propagates down the transmission lines, it forward biases two of the diodes and reverse biases the other two diodes. Assuming that the diodes are matched, a zero voltage potential should appear at nodes 54 and 55 of the RF balun creating a virtual ground. The arrows in FIG. 4 indicate the current flow direction. The diode mixing process of this mixer is the same as for conventional mixers.

Figure 5:
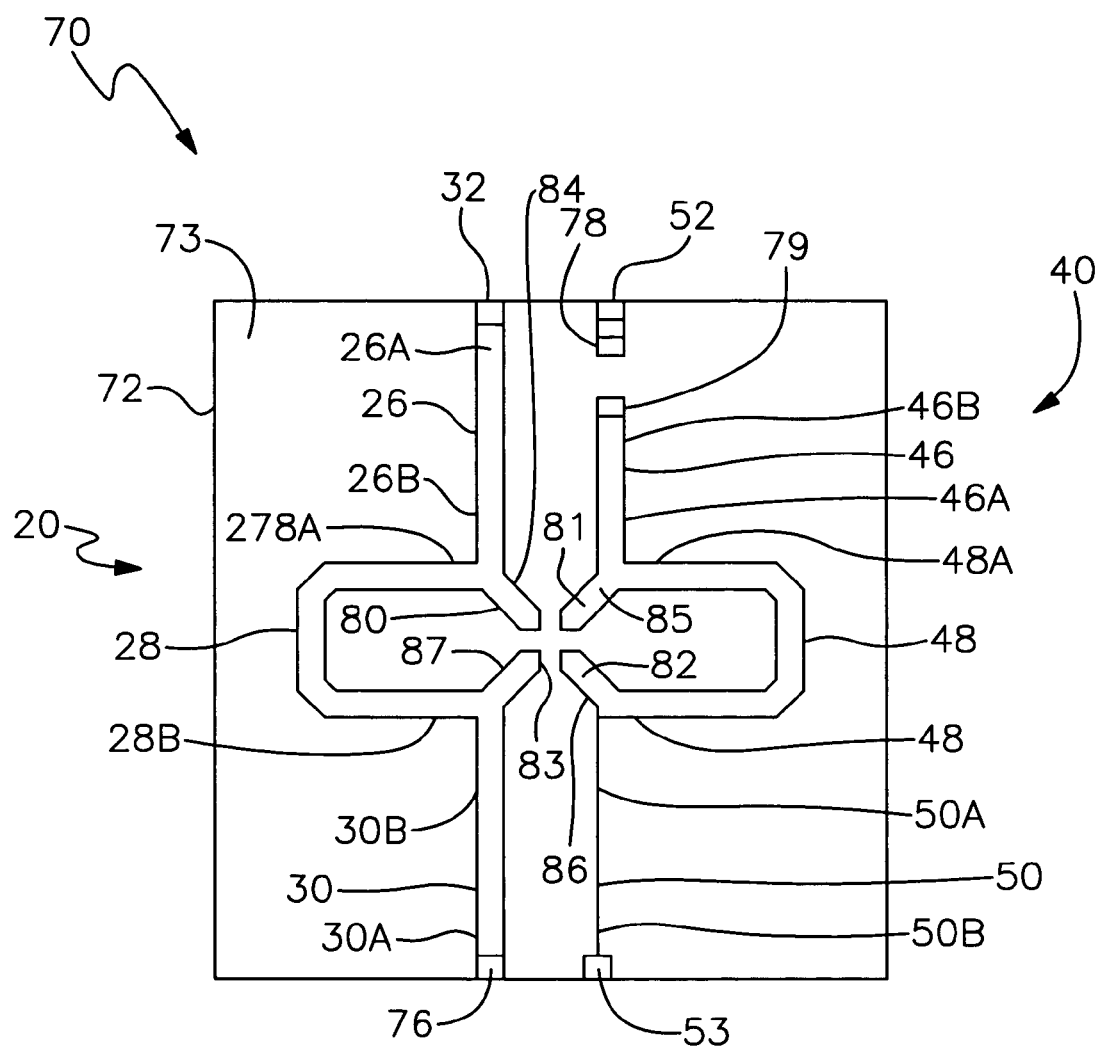
FIG. 5 is a top view of a physical embodiment of the double balanced mixer of FIG. 3 without the diode package and capacitor.
Figure 6:
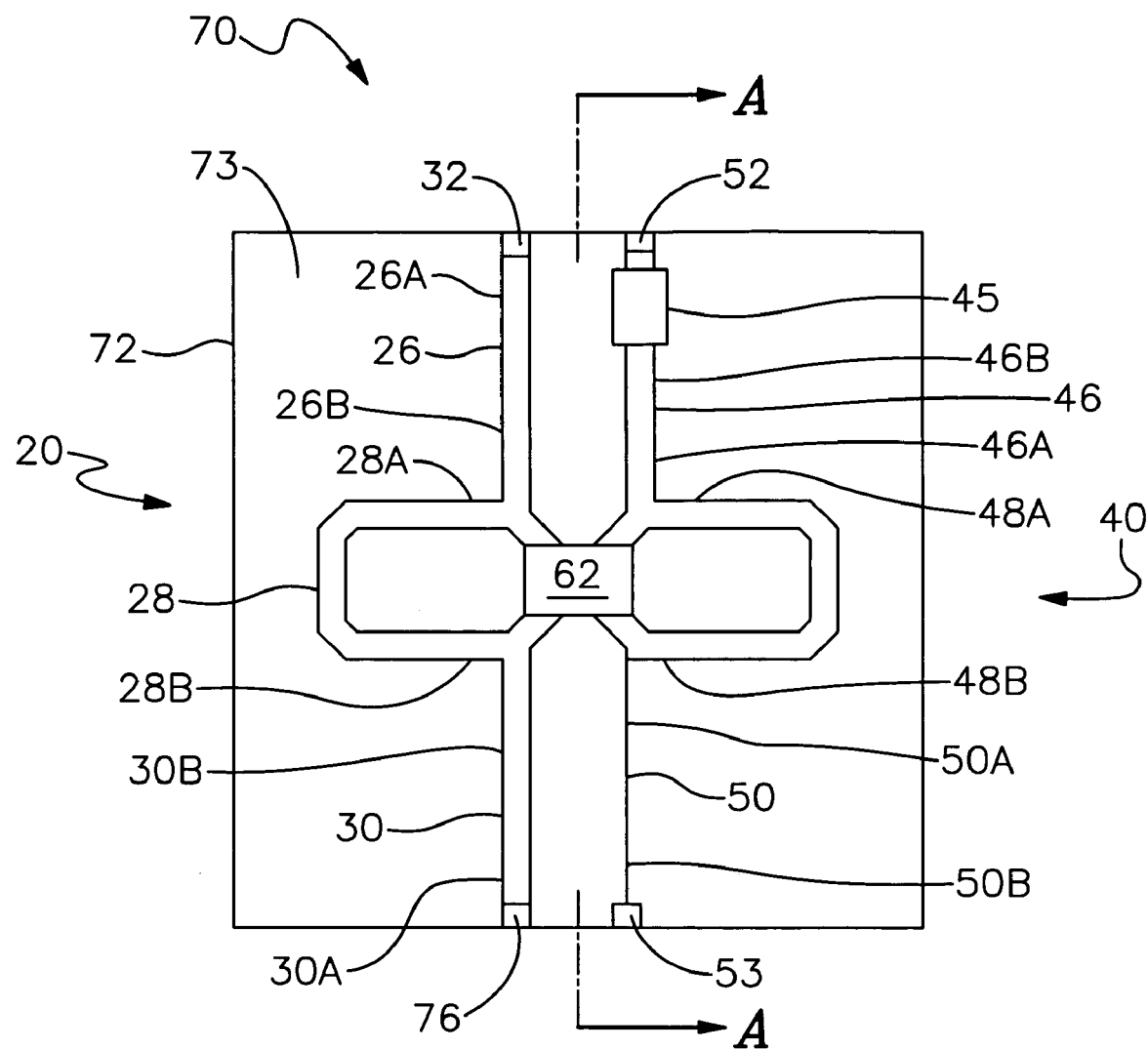
FIG. 6 is a top view of a physical embodiment of the double balanced mixer of FIG. 3 including the diode package and capacitor.
Figure 7:
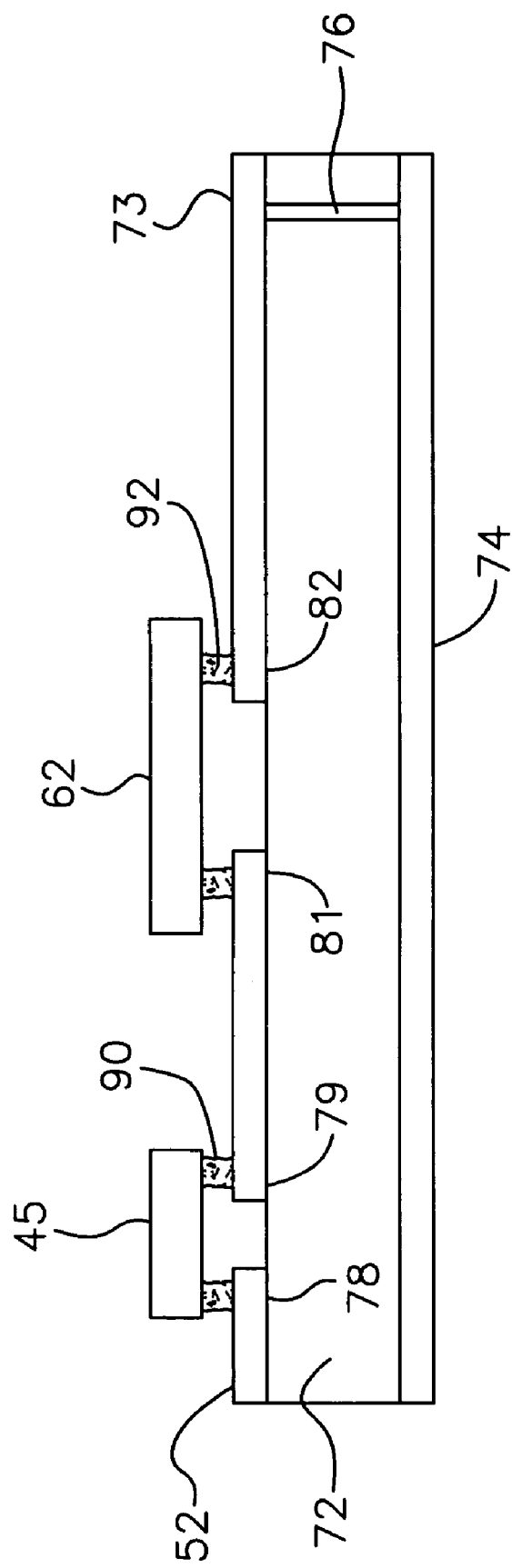
FIG. 7 is a cross-sectional view of FIG. 6 taken along section line A—A.

Referring to FIGS. 5–7, the double balanced mixer 60 shown in the schematic of FIG. 3 is realized in a physical mixer package 70. Mixer package 70 has a substrate or printed circuit board 72. Printed circuit board 72 has a top surface 73 and bottom surface 74. A ground plane 75 is located on bottom surface 74. The transmission lines and circuit line are patterned on top surface 73 as printed circuit lines with a specific line width and length. Printed circuit board 72 can be made from a 20 mil thick FR4 printed circuit board with a dielectric constant of 3.38 and using ½ ounce copper foil. Printed circuit board 72 can be made using conventional printed circuit board manufacturing techniques.

LO balun 20 is shown on the left side of printed circuit board 72 and RF balun 40 is on the right side. LO balun 20 has a transmission line 26 located on top surface 73 and has ends 26A and 26B. LO port 32 is attached to end 26A. A half wavelength transmission line 28 is mounted on top surface 73 and has ends 28A and 28B. Transmission line 28 is C-shaped. Ends 28A and 26B are connected together. A stub 84 is connected to the junction of ends 28A and 26B. A diode connection pad 80 is attached to the end of stub 84. A quarter wavelength transmission line 30 is mounted on top surface 73 and has ends 30A and 30B. Ends 28B and 30B are connected together. A stub 87 is connected to the junction of ends 28B and 30B. A diode connection pad 83 attached to the end of stub 87.

A plated through hole or via 76 extends through printed circuit board 72 between top surface 73 and bottom surface 74. Via 76 is connected to end 30A. Via 76 electrically connects quarter wave transmission line 30 with ground plane 75.

RF balun 40 has a transmission line 46 located on top surface 73 and has ends 46A and 46B. A capacitor pad 79 is connected to end 46B. RF port 52 is connected to capacitor pad 78. A half wavelength transmission line 48 is mounted on top surface 73 and has ends 48A and 48B. Transmission line 48 is C-shaped. Ends 48A and 46A are connected together. A stub 85 is connected to the junction of ends 48A and 46A. A diode connection pad 81 is attached to the end of stub 85. A printed circuit line 50 is mounted on top surface 73 and has ends 50A and 50B. Ends 48B and 50A are connected together. A stub 86 is connected to the junction of ends 48B and 50A. A diode connection pad 82 is attached to the end of stub 86. IF port 53 is connected to end 50B.

FIG. 7 shows diode package 62 and capacitor 45 soldered to printed circuit board 72. Diode package 62 is a commercially available, medium barrier, SQT-143 crossover quad diode package. Diodes of other barrier heights could also be used to achieve the desired performance. Four solder joints 92 form an electrical connection between the diode package 62 and diode connection pads 80, 81, 82 and 83. Two solder joints 90 form an electrical connection between the capacitor package 45 and capacitor connection pads 78 and 79.

A mixer 70 according to the present invention was fabricated using a 20 mil thick printed circuit board with a dielectric constant of 3.38 and ½ ounce copper foil. The LO operating frequency was specified to be 4 to 5 GHz and the IF frequency was specified to be 30 MHz. The resulting center operating frequency was 4.5 GHz.

Through the use of microstrip transmission line calculations, the length and width of the microstrip transmission lines were determined. The one half wavelength 50 ohm transmission lines 28 and 48 on a 20 mil dielectric substrate with a dielectric constant of 3.38 are approximately 800 mils (0.8 inches) in length and 47 mils (0.047 inches) in width. The IF port impedance was specified at 125 ohms, which resulted in a circuit line 50 of approximately 8 mils (0.008 inches) in width. Capacitor 45 has a value of 5 pico-farads, which results in a capacitive reactance (Xc) of 7 ohms at 4.5 GHz and 1000 ohms at 30 MHz. The LO source was specified to be 13 dBm. The overall size of printed circuit board 72 was less than 1 inch by 1 inch.

Mixer 70 was evaluated for performance as both an up and down converter. The mixer performance was excellent in both applications. The LO and RF ports are interchangable. When the LO signal was applied into the RF port and the RF signal was applied to the LO port, it was noted that the conversion loss was improved, while the isolation was degraded.

Figure 8:
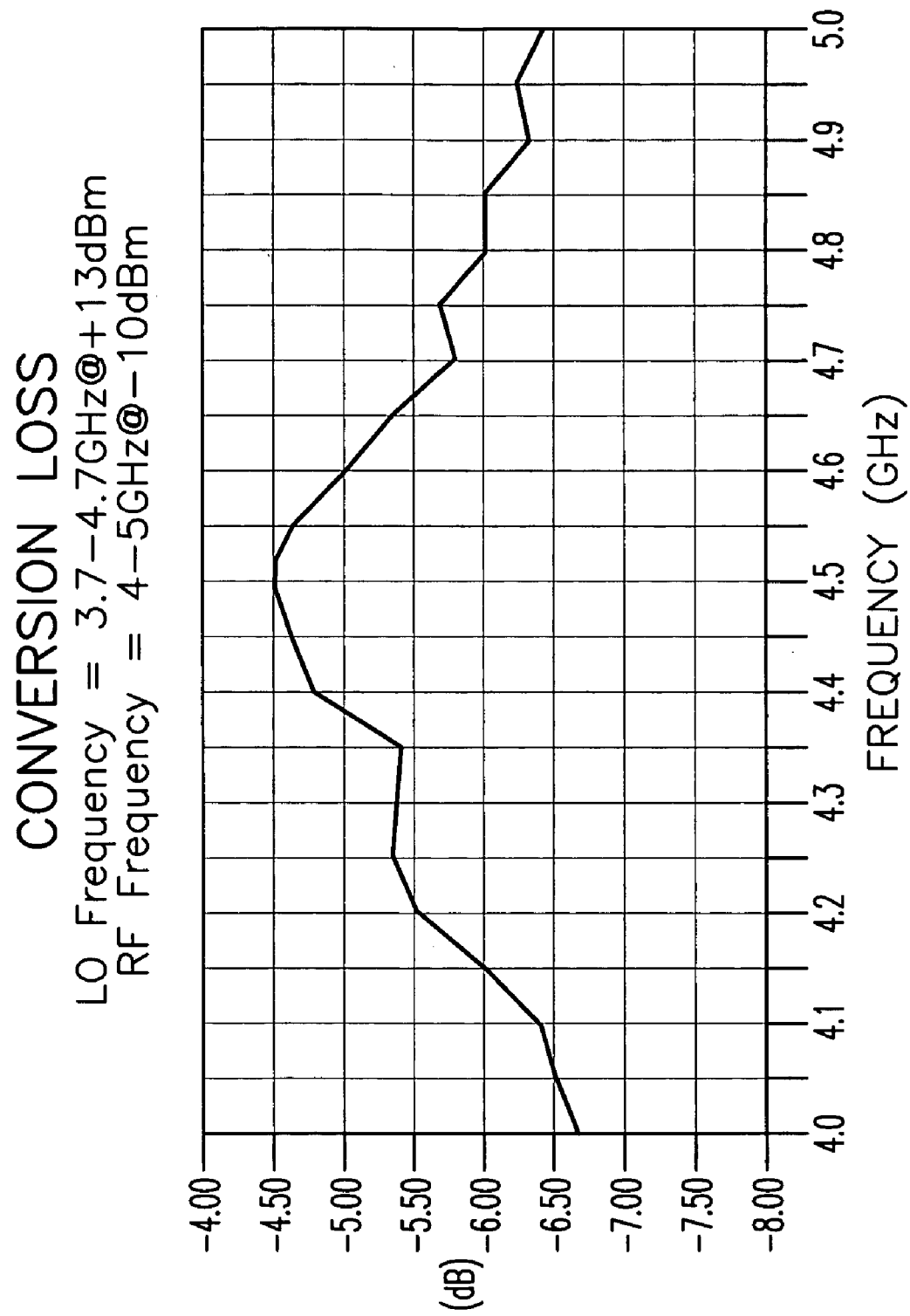
FIG. 8 is a graph of conversion loss versus frequency for the mixer of FIG. 6.
Figure 9:
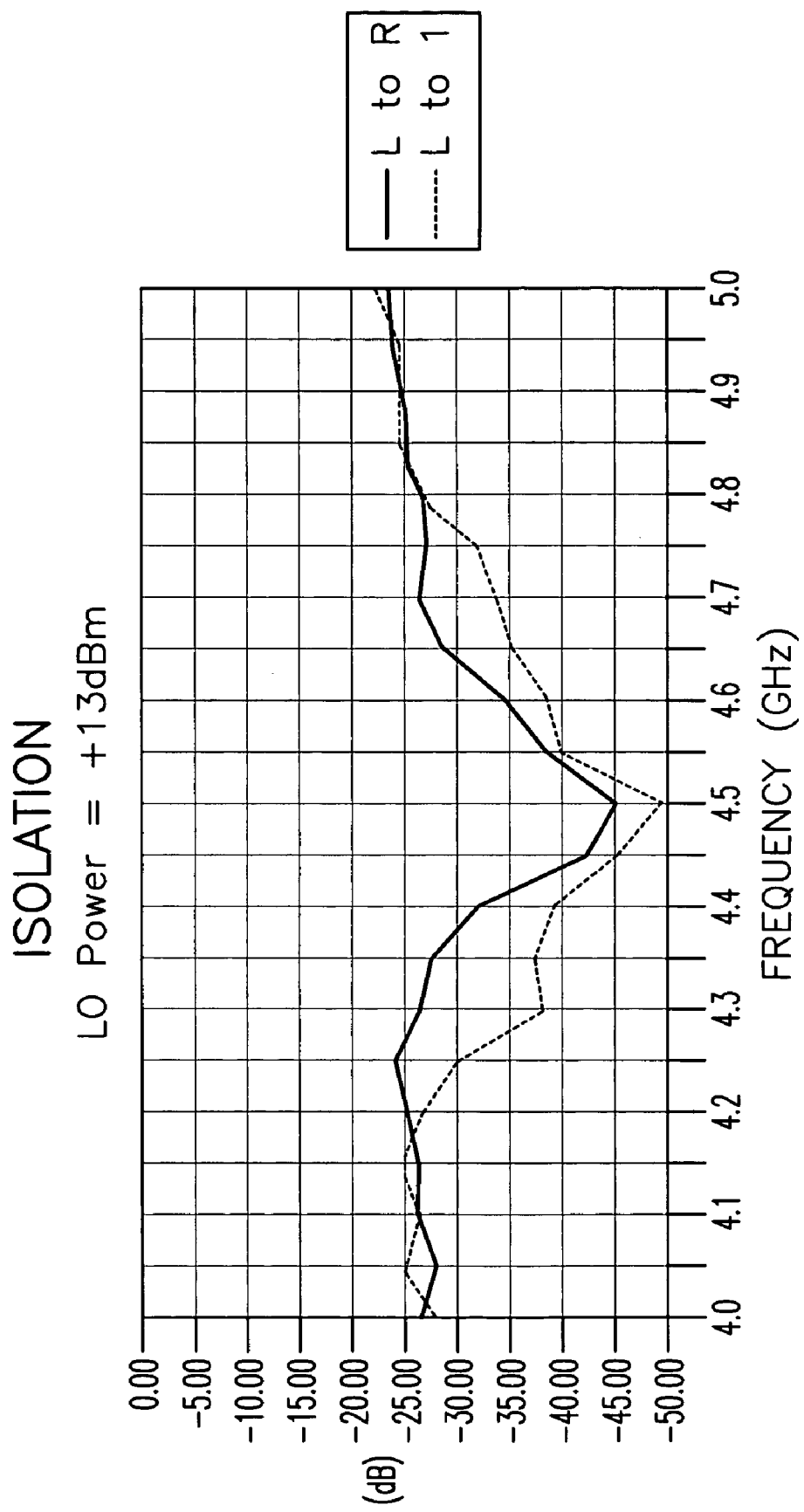
FIG. 9 is a graph of isolation versus frequency for the mixer of FIG. 6. The isolation is shown between the LO port and the RF port and between the LO port and the IF port.

Referring to FIG. 8, the conversion loss versus frequency of mixer 70 as a down converter is shown. FIG. 9 shows isolation versus frequency between the LO port and the RF port and between the LO port and the IF port.

The mixer used for this evaluation had a relatively low IF frequency. The LO signal was to the low side so that the frequency of operation of the LO balun was slightly lower than for the RF balun. Therefore, the LO balun could have been designed to be proportionally longer than the RF balun. This is an important difference from single balanced mixers. The present mixer can be designed specifically for high or low side operation to achieve optimal performance.

Other Measurements for mixer 70 are with plo=+13 dBm:
IF Bandwidth=DC-500 MHz
1 dB Compression Point=8 dBm
Input third order intercept=20 dBm (RF delta=1 MHz)
R-I Isolation=28 dB typical, 22 dB max.

For miniaturization, a higher dielectric constant material such as Alumina or Gallium Arsinide can be used. Gallium Arsinide has a dielectric constant of 12.9 and is typically built on a 4 mil thick substrate. This mixer can be very small, especially at smaller wavelength bandwidths. The use of spiral transmission lines can be used in Gallium Arsinide devices to further reduce the overall size of the device. The overall length of a transmission line using a spiral is reduced to approximately 0.6 of its overall straight line length.

The present invention has several advantages. Since, baluns 20 and 40 are integrated onto substrate 72 they take up less space, resulting in a smaller package.

Mixer 70 has the simplicity and low cost benefits of a single balanced mixer and the performance advantages of a double balanced mixer. The double balanced mixer is useful for radio integration, microwave, millimeter wave, MMIC and multi-chip modules. The single plane design allows for a simple implementation of low cost packaged cross over quad diodes, which eliminate the need for jumpers, bridges, vias and bond wires.

Many prior art mixer designs require multi-layer broadside coupled baluns. These mixers offer good broadband performance. However, the cost is high. Many applications do not require wide bandwidths. In some instances, unnecessarily wide bandwidths can allow the passage of stray signals and harmonics requiring the use of extra filters.

The microstrip transmission line structure of baluns 20 and 40 are low in cost and can be readily designed for a specific operating frequency. The present invention can be manufactured with high yields. The present invention does not use coupling, therefore less energy is lost. Less energy loss results in lower conversion loss and a lower noise figure. The mixer of the present invention performs well up to bandwidths of an octave, making it suitable for many wireless applications. It is advantageous to use a mixer with a bandwidth that is limited to the requirements of the radio in order to utilize the mixers inherent band rejection outside the frequency band of interest.

The present invention can achieve wider bandwidths with the use of additional 180 degree lines in parallel with each other separated by quarter wavelength transmission lines.

The theoretical frequency limitation of this mixer is determined by the parasitics of the substrate, diode and package.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. A mixer for mixing a radio frequency signal with a local oscillator signal to provide an intermediate frequency signal, comprising:
   a substrate having a top surface and a bottom surface;
   a local oscillator balun mounted on the top surface including, a first, second and third transmission line, the first and second transmission lines connected at a first node and the second and third transmission lines connected at a second node;
   a radio frequency balun mounted on the top surface including, a fourth and fifth transmission line and a circuit line, the fourth and fifth transmission lines connected at a third node and the fifth transmission line and the circuit line connected at a fourth node; and
   a diode package mounted to the top surface and connected to the nodes, the diode package having a first, second third and fourth diode, the first diode connected between the first and second nodes, the second diode connected between the third and fourth nodes, the third diode connected between the first and fourth nodes, the fourth diode connected between the second and third nodes.

2. The mixer according to claim 1, wherein a local oscillator port is connected to the first transmission line.

3. The mixer according to claim 1, wherein an intermediate frequency port is connected to the circuit line.

4. The mixer according to claim 1, wherein a capacitor is connected to the fourth transmission line.

5. The mixer according to claim 4, wherein a radio frequency port is connected to the capacitor.

6. The mixer according to claim 1, wherein the second transmission line has a length that is one half wavelength of an operating frequency.

7. The mixer according to claim 1, wherein the third transmission line has a length that is one quarter wavelength of an operating frequency.

8. The mixer according to claim 1, wherein the fifth transmission line has a length that is one half wavelength of an operating frequency.

9. The mixer according to claim 1, wherein a ground plane is attached to the bottom surface.

10. The mixer according to claim 9, wherein a via extends between the ground plane and the third transmission line.

11. A mixer for mixing a radio frequency signal with a local oscillator signal to provide an intermediate frequency signal, comprising:
   a printed circuit board having a top surface and a bottom surface;
   a first transmission line mounted on the top surface, the first transmission line having a first and second end;
   a local oscillator port connected to the first end;

a first half wavelength transmission line mounted on the top surface, the first half wavelength transmission line having a third and fourth end, the second end connected to the third end;

a quarter wavelength transmission line mounted on the top surface, the quarter wavelength transmission line having a fifth and sixth end, the fifth end connected to the fourth end and the sixth end connected to ground;

a second transmission line mounted on the top surface, the second transmission line having a seventh and eighth end;

a capacitor mounted to the top surface and connected to the eighth end;

a radio frequency port connected to the capacitor;

a second half wavelength transmission line mounted on the top surface, the second half wavelength transmission line having a ninth and tenth end, the ninth end connected to the seventh end;

a circuit line mounted on the top surface, the circuit line having an eleventh and twelfth end, the eleventh end connected to the tenth end;

an intermediate frequency port connected to the twelfth end; and a diode package mounted to the top surface.

12. The mixer according to claim 11, wherein a first stub is connected to the junction of the second and third ends, a second stub is connected to the junction of the fourth and fifth ends, a third stub is connected to the junction of the seventh and ninth ends and a fourth stub is connected to the junction of the tenth and eleventh ends.

13. The mixer according to claim 12, wherein the diode package has a first, second third and fourth diode, the first diode connected between the first and second stubs, the second diode connected between the third and fourth stubs, the third diode connected between the first and fourth stubs, the fourth diode connected between the second and third stubs.

14. The mixer according to claim 13, wherein the stubs each have an attached pad.

15. The mixer according to claim 14, wherein a solder joint connects the pad to the diode package.

16. The mixer according to claim 11, wherein a ground plane is attached to the bottom surface.

17. The mixer according to claim 16, wherein a via extends between the ground plane and the sixth end.

18. The mixer according to claim 11, wherein the width of the transmission lines are less than 0.047 inches.

19. The mixer according to claim 11, wherein the width of the circuit line is less than 0.008 inches.

20. The mixer according to claim 11, wherein the half wavelength transmission lines are c-shaped.

21. The mixer according to claim 11, wherein each diode has an anode and a cathode.

22. A double balanced mixer comprising:

a first transmission line having a first and second end;

a local oscillator port connected to the first end;

a first half wavelength transmission line having a third and fourth end, the second end connected to the third end at a first node;

a quarter wavelength transmission line having a fifth and sixth end, the fifth end connected to the fourth end at a second node and the sixth end connected to ground;

a second transmission line having a seventh and eighth end;

a capacitor connected to the eighth end;

a radio frequency port connected to the capacitor;

a second half wavelength transmission line having a ninth and tenth end, the ninth end connected to the seventh end at a third node;

a circuit line having an eleventh and twelfth end, the eleventh end connected to the tenth end at a fourth node;

an intermediate frequency port connected to the twelfth end;

a first diode connected between the first and third nodes;

a second diode connected between the second and fourth nodes;

a third diode connected between the first and fourth nodes; and a fourth diode connected between the third and second nodes.

23. The mixer according to claim 22, wherein the mixer is mounted to a printed circuit board.

24. The mixer according to claim 23, wherein the printed circuit board has a top surface and a bottom surface, a ground plane being located on the bottom surface.

25. The mixer according to claim 24, wherein a via extends through the printed circuit board between the top and bottom surface.

* * * * *